United States Patent
Tan et al.

(10) Patent No.: US 9,906,157 B2
(45) Date of Patent: Feb. 27, 2018

(54) PACKAGE ASSEMBLY

(71) Applicant: Delta Electronics Int'l (Singapore) Pte Ltd, Singapore (SG)

(72) Inventors: Chad-Yao Tan, Singapore (SG); Da-Jung Chen, Singapore (SG)

(73) Assignee: DELTA ELECTRONICS INT'L (SINGAPORE) PTE LTD, Singapore (SG)

(*) Notice: Subject to any disclaimer, the term of this patent is extended or adjusted under 35 U.S.C. 154(b) by 43 days.

(21) Appl. No.: 15/165,719

(22) Filed: May 26, 2016

(65) Prior Publication Data
US 2016/0352245 A1 Dec. 1, 2016

(30) Foreign Application Priority Data
May 29, 2015 (SG) .............. 10201504274S

(51) Int. Cl.
*H02M 7/00* (2006.01)
*H01L 23/053* (2006.01)
*H01L 21/48* (2006.01)
*H01L 23/00* (2006.01)

(52) U.S. Cl.
CPC .......... *H02M 7/003* (2013.01); *H01L 23/053* (2013.01); *H01L 21/4817* (2013.01); *H01L 24/49* (2013.01)

(58) Field of Classification Search
CPC ...... H02M 7/003; H01L 23/053; H01L 23/18; H01L 23/49811; H01L 23/08; H01L 23/06; H01L 21/565; H01L 21/54; H01L 21/4817; H01L 25/072; H01L 25/0655; H01L 25/50; H01L 24/85; H01L 24/49; H01L 23/4006; H01L 23/4093; H01L 23/40; H05K 5/0213

USPC ....... 361/704, 707, 717–719, 728, 746, 752; 174/59, 541, 551; 257/706, 707, 712, 257/717, 718, 719, E23.018, E23.181, 257/E23.182, E23.183, E23.188, E23.08, 257/E23.083, E23.084, E23.086
See application file for complete search history.

(56) References Cited

U.S. PATENT DOCUMENTS

| | | | |
|---|---|---|---|
| 4,387,388 A | 6/1983 | Zakhariya | |
| 4,514,587 A | 4/1985 | Van Dyk Soerewyn | |
| 4,788,626 A | 11/1988 | Neidig et al. | |
| 7,477,518 B2 * | 1/2009 | Stolze | H01L 23/049 165/185 |
| 8,690,586 B2 * | 4/2014 | Schneider | H01R 12/91 439/66 |

(Continued)

*Primary Examiner* — Steven T Sawyer
*Assistant Examiner* — Sagar Shrestha
(74) *Attorney, Agent, or Firm* — Kirton McConkie; Evan R. Witt

(57) ABSTRACT

A package assembly includes a main body, a power module and replaceable top cover. The main body has a hollow part. The power module is disposed within a hollow part of the main body and located beside the bottom part of the main body. At least one first pin is disposed on a surface of the power module. The at least one first pin is accommodated within the hollow part of the main body and partially protruded out of a first open end of the hollow part near a top part of the main body. The top cover is disposed in the hollow part of the main body, and includes at least one first opening corresponding to the at least one first pin. The at least one first pin is penetrated through the corresponding first opening and exposed outside the first open end of the hollow part.

10 Claims, 9 Drawing Sheets

(56) References Cited

U.S. PATENT DOCUMENTS

| | | | | |
|---|---|---|---|---|
| 9,219,325 | B2* | 12/2015 | Endo | H01R 12/73 |
| 9,263,820 | B2* | 2/2016 | Mattiuzzo | H01R 13/415 |
| 9,431,311 | B1* | 8/2016 | Lin | H01L 25/072 |
| 9,620,877 | B2* | 4/2017 | Yao | H01R 13/05 |
| 2008/0158822 | A1* | 7/2008 | Stolze | H01L 23/049 |
| | | | | 361/704 |
| 2009/0194884 | A1* | 8/2009 | Stolze | H01L 25/072 |
| | | | | 257/773 |
| 2009/0197439 | A1* | 8/2009 | Nabilek | H01R 12/585 |
| | | | | 439/82 |
| 2010/0149774 | A1* | 6/2010 | Matsumoto | H01L 23/055 |
| | | | | 361/783 |
| 2012/0001227 | A1* | 1/2012 | Takahashi | H02M 7/003 |
| | | | | 257/140 |
| 2012/0115339 | A1* | 5/2012 | Schaarschmidt | H01R 12/585 |
| | | | | 439/66 |
| 2012/0241953 | A1* | 9/2012 | Yamada | H01L 23/4334 |
| | | | | 257/737 |
| 2014/0199861 | A1* | 7/2014 | Mattiuzzo | H01R 13/415 |
| | | | | 439/81 |
| 2014/0254116 | A1* | 9/2014 | Takahashi | H05K 1/18 |
| | | | | 361/752 |
| 2014/0285972 | A1* | 9/2014 | Hong | H01L 23/4006 |
| | | | | 361/707 |
| 2014/0355219 | A1 | 12/2014 | Tada et al. | |
| 2015/0189772 | A1* | 7/2015 | Prajuckamol | H05K 5/0213 |
| | | | | 174/61 |
| 2016/0218454 | A1* | 7/2016 | Chang | H05K 7/1432 |
| 2016/0240452 | A1* | 8/2016 | Prajuckamol | H01L 23/49811 |
| 2016/0247735 | A1* | 8/2016 | Lin | H01L 21/50 |
| 2017/0170084 | A1* | 6/2017 | Yao | H01L 23/053 |

* cited by examiner

PACKAGE ASSEMBLY

FIELD OF THE INVENTION

The present invention relates to a package assembly, and more particularly to a package assembly with a replaceable top cover for allowing pins of a power module to be penetrated through.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single circuit module. For example, a power module is one of the widely-used circuit modules. An example of the power module includes but is not limited to a DC-to-DC converter, a DC-to-AC converter or an AC-to-DC converter. After the electronic components (e.g. capacitors, resistors, inductors, transformers, diodes and transistors) are integrated as a power module, the power module may be installed on a system circuit board.

A conventional package structure of a power module will be illustrated as follows. Firstly, plural power semiconductor bare chips, plural passive components and plural pins are disposed on a substrate. Through the pins, the power module can be connected with an external circuitry. In particular, the power semiconductor bare chips, the passive components and the pins are welded on the substrate via solder paste. Then, the power semiconductor bare chips, the passive components and the pins are connected with each other through conductive wires by a wire bonding process. Consequently, an exposed power module is produced. Moreover, the power semiconductor bare chips, the passive components and the pins of the exposed power module are covered by an inverted U-shaped covering member. The covering member has plural openings corresponding to the pins. The pins are penetrated through the corresponding pins and partially exposed outside the covering member. Meanwhile, the package structure of the power module is produced. Moreover, the exposed pins may be inserted into corresponding insertion holes of a printed circuit board.

However, the above package structure of the power module still has some drawbacks. For example, since the number and positions of the openings of the covering member are fixed, the covering member is only applied to a specified power module with the fit pin number and pin positions. That is, the utilization flexibility is not satisfactory. If the number and positions of the pins of the power module cannot fit the covering member, the covering member cannot be used for the power module. Under this circumstance, it is necessary to rebuild the new covering member. Consequently, the fabricating cost is increased.

For solving the above drawbacks, another package assembly of the power module was disclosed. The package assembly comprises a non-plate package shell and a power module. Similarly, the power module is an exposed power module. The power module is completely covered by the package shell. The package shell has plural openings in a matrix configuration (e.g., in an M×N matrix configuration). The pins of the power module are penetrated through corresponding openings of the package shell. Since the openings of the package shell are arranged in the matrix configuration, the package shell can be applied to many types of power modules with different pin numbers or pin positions. Under this circumstance, the utilization flexibility is enhanced.

However, if the positions, number and size of the pins of the power module cannot fit the openings of the package shell, the applications of the above package assembly are restricted. In other words, the package shell cannot be applied to all types of power modules. That is, if the positions, number and size of the pins of the power module cannot fit the openings of the package shell, it is necessary to rebuild the new package shell. Consequently, the fabricating cost is increased. Recently, the power module is packaged as an embedded power module. That is, the active component(s) and/or the passive component(s) are embedded within the substrate, and the pins are disposed on the surface of the substrate at the positions corresponding to the active component(s) and/or the passive component(s). Since the number and positions of the active component(s) and/or the passive component(s) embedded within the substrate are diversified, the positions, number and size of the pins are also diversified. In other words, the applications of the above package assembly to the embedded power module are largely reduced.

Therefore, there is a need of providing an improved package assembly in order to eliminate the above drawbacks.

SUMMARY OF THE INVENTION

The present invention provides a package assembly. The package assembly comprises a main body, a power module and a replaceable top cover. The pins of the power module can be penetrated through the corresponding openings of the top cover. The top cover is selected according to the positions, number and size of the pins of the power module. Consequently, the utilization flexibility of the package assembly is largely enhanced and the fabricating cost is reduced. More especially, the package assembly can be applied to the embedded power module.

An aspect of the present invention provides a package assembly. The package assembly includes a main body, a power module and replaceable top cover. The main body has a hollow part. The hollow part runs through a top part and a bottom part of the main body. The power module is disposed within the hollow part of the main body and located beside the bottom part of the main body. At least one first pin is disposed on a surface of the power module. The at least one first pin is accommodated within the hollow part of the main body and partially protruded out of a first open end of the hollow part near the top part of the main body. The top cover is disposed in the hollow part of the main body, and includes at least one first opening corresponding to the at least one first pin. The at least one first pin is penetrated through the corresponding first opening and exposed outside the first open end of the hollow part.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
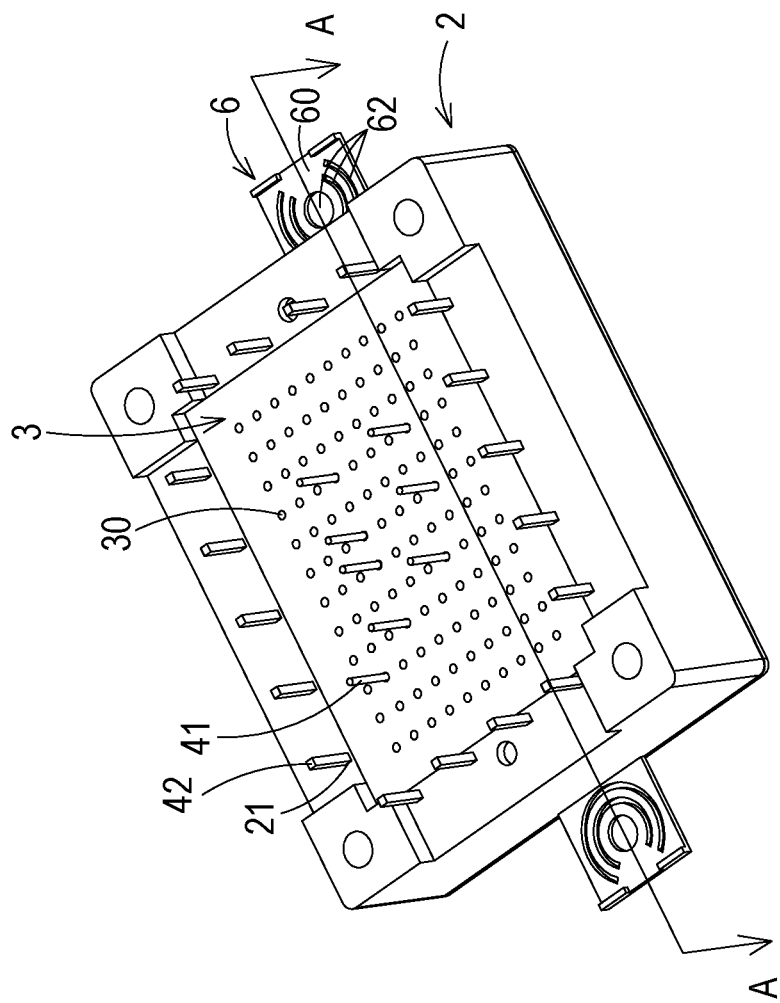
FIG. 1 is a schematic perspective view illustrating a package assembly according to a first embodiment of the present invention.
Figure 2:
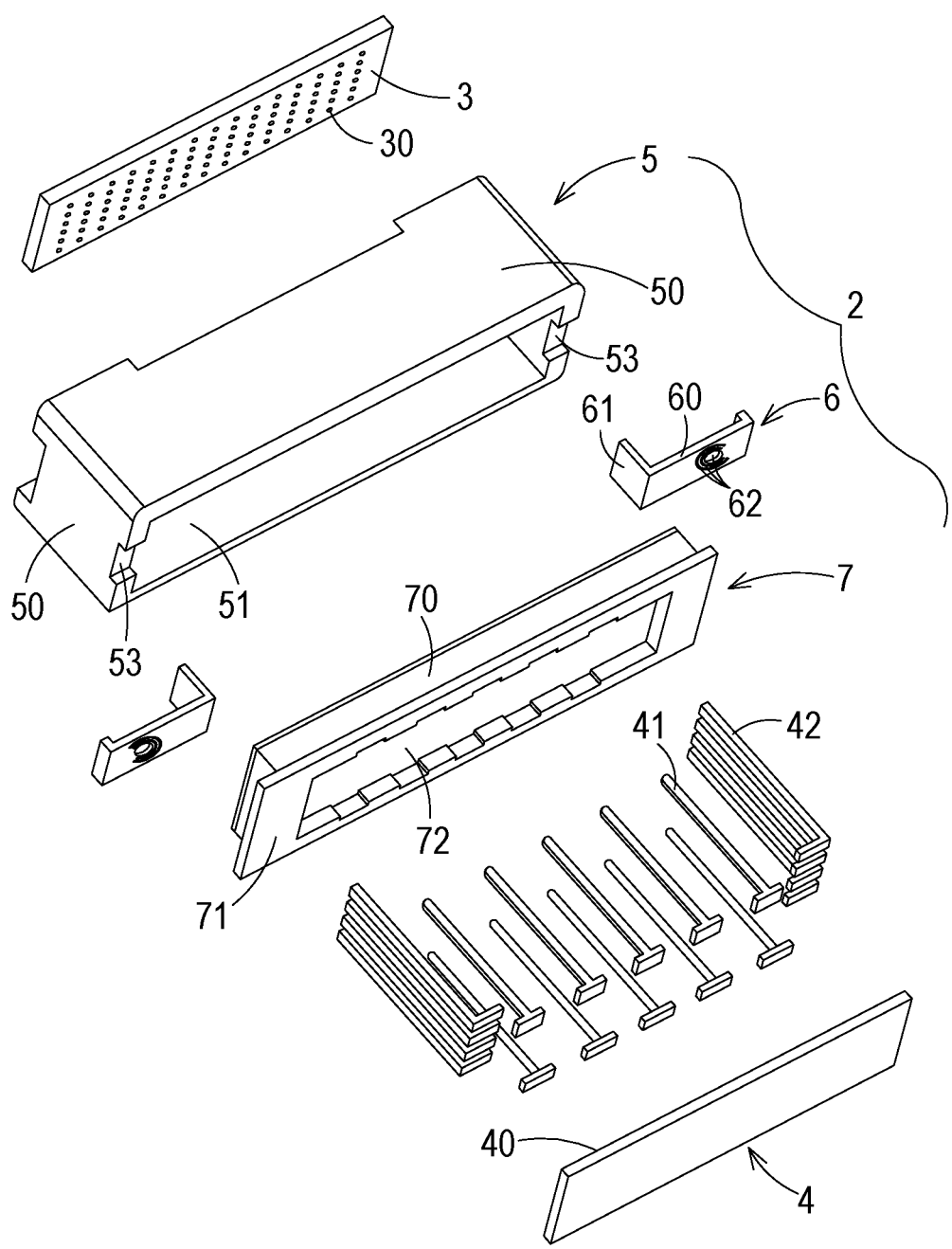
FIG. 2 is a schematic exploded view illustrating the package assembly according to the first embodiment of the present invention.
Figure 3:
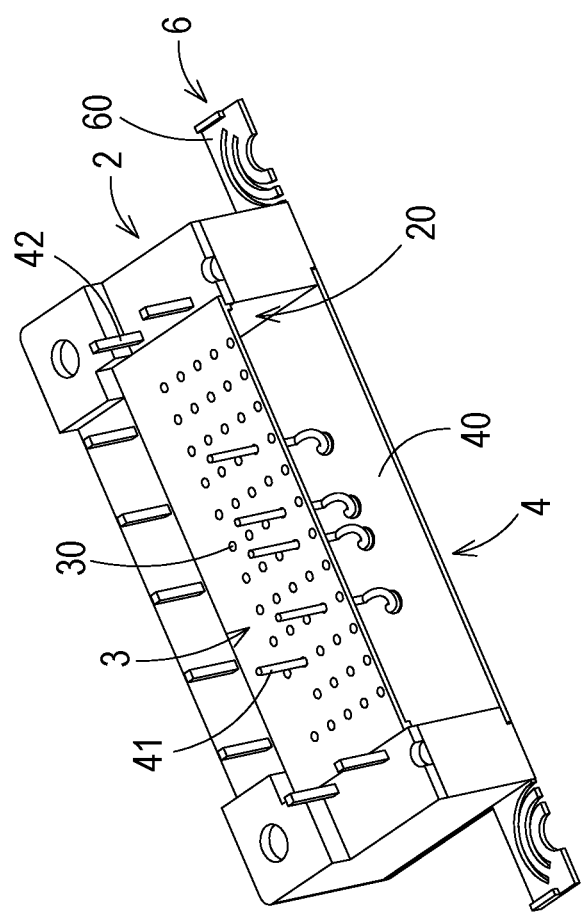
FIG. 3 is a schematic cutaway view illustrating the package assembly of FIG. 1 and taken along the line A-A.

FIG. 1 is a schematic perspective view illustrating a package assembly according to a first embodiment of the present invention. FIG. 2 is a schematic exploded view illustrating the package assembly of FIG. 1. FIG. 3 is a schematic cutaway view illustrating the package assembly of FIG. 1 and taken along the line A-A. Please refer to FIGS. 1, 2 and 3. The package assembly 1 comprises a main body 2, a top cover 3 and a power module 4. The main body 2 is substantially a rectangular box with a hollow part 20. The hollow part 20 runs through a top part and a bottom part of the main body 2.

The power module 4 is disposed within the hollow part 20 of the main body 2 and located beside the bottom part of the main body 2. Moreover, a second open end of the hollow part 20 near the bottom part of the main body 2 is covered by the power module 4. Moreover, at least one first pin 41 is disposed on a surface 40 of the power module 4. In particular, the at least one first pin 41 is disposed on a middle region of the surface 40 of the power module 4. When the second open end of the hollow part 20 near the bottom part of the main body 2 is covered by the power module 4, the at least one first pin 41 is accommodated within the hollow part 20 of the main body 2 and partially protruded out of a first open end of the hollow part 20 near the top part of the main body 2.

In some embodiments, the at least one first pin 41 is welded on the surface 40 of the power module 4. An example of the power module 4 includes but is not limited to an embedded power module. That is, the power module 4 comprises a substrate, one or more active components and/or one or more passive components, wherein the active components and/or the passive components are embedded within the substrate and electrically connected with the at least one first pin 41. Moreover, the power module 4 may be fixed on the bottom part of the main body 2 by an adhesive or a locking means.

The top cover 3 is a flat covering plate, which is disposed within the hollow part 20 for covering the first open end of the hollow part 20. The top cover 3 is abutted against a portion of the main body 2, so that the top cover 3 and the main body 2 are combined together. Moreover, the top cover 3 comprises at least one hole 30 corresponding to the at least one first pin 41 of the power module 4. As shown in FIG. 1, the top cover 3 comprises plural first openings 30. The first openings 30 are aligned with corresponding first pins 41 of the power module 4. When the first open end of the hollow part 20 is covered by the top cover 3, the first pins 41 of the power module 4 are penetrated through the corresponding first openings 30 of the top cover 3. Consequently, the first pins 41 are partially exposed outside the hollow part 20 of the main body 2 and the top cover 3, and located at the external portion of the package assembly 1. In this embodiment, the size of the top cover 3 fits the size of the first open end of the hollow part 20.

Figure 4A:
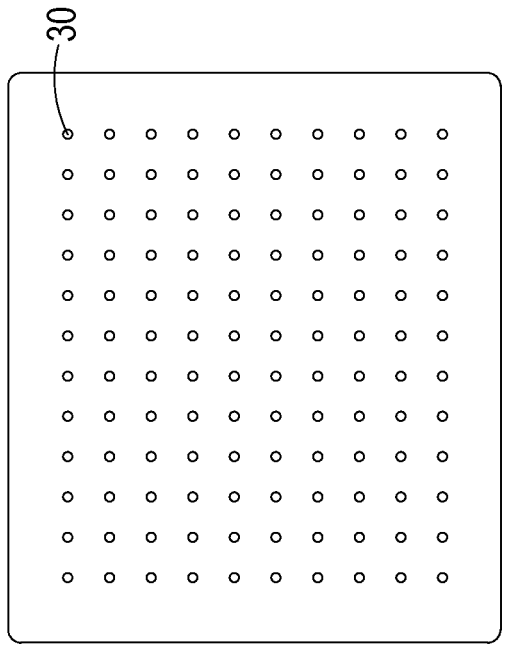
FIG. 4A is a schematic top view illustrating the top cover of the package assembly according to the first embodiment of the present invention.
Figure 4B:
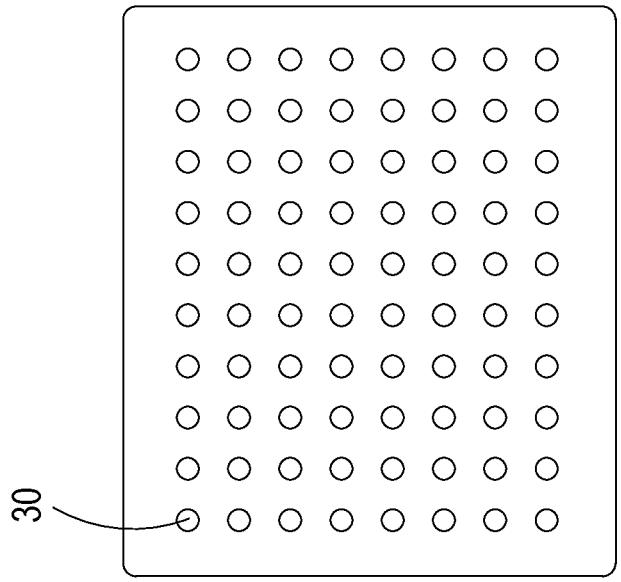
FIG. 4B is a schematic top view illustrating a variant example of the top cover of FIG. 4A.

FIG. 4A is a schematic top view illustrating the top cover of the package assembly of FIG. 1. FIG. 4B is a schematic top view illustrating a variant example of the top cover of FIG. 4A. In some embodiments, the plural first openings 30 of the top cover 3 are arranged in a matrix configuration. As shown in FIG. 4A, the plural first openings 30 of the top cover 3 are arranged in a 10×12 matrix configuration. As shown in FIG. 4B, the plural first openings 30 of the top cover 3 are arranged in an 8×10 matrix configuration. The first openings 30 as shown in FIG. 4A are smaller than the first openings 30 as shown in FIG. 4B. It is noted that the positions, number and size of the first openings 30 of the top cover 3 are not restricted. Moreover, the positions, number and size of the first openings 30 may be determined according to the positions, number and size of the first pins 41 of the power module 4. For example, the top cover 3 may comprise one or plural first openings 30. Alternatively, the plural first openings 30 may be arranged in an irregular configuration.

In accordance with a feature of the present invention, the top cover 3 of the package assembly 1 is replaceable. According to the positions, number and size of the first pins 41 of the power module 4, the top cover 3 with the first openings 30 corresponding to the first pins 41 is selected. Consequently, the first pins 41 of the power module 4 can be penetrated through the corresponding first openings 30, wherein the first pins 41 are partially exposed outside the hollow part 20 of the main body 2 and the top cover 3 and located at the external portion of the package assembly 1. Moreover, since the first pins 41 are exposed outside the hollow part 20 of the main body 2 and the top cover 3, the first pins 41 may be inserted into corresponding insertion holes of an external circuit (e.g., a printed circuit board) and electrically connected with the external circuit. Since the top cover 3 of the package assembly 1 is replaceable, the utilization flexibility of the package assembly 1 is enhanced. Since the top cover 3 is selected according to the first pins 4 of the power module 4, the package assembly 1 can have diversified variant examples by providing different power module 4 with different first pin topologies and providing the fit top cover 3. As previously described, the conventional technology has to rebuild the mold of the non-plate cover or the non-plate package shell according to the number and positions of the pins of the power module. Since the top cover 3 of the package assembly 1 of the present invention is replaceable, the fabricating cost of the package assembly 1 is largely reduced.

Please refer to FIGS. 1 and 2 again. In some embodiments, at least one second pin 42 is disposed on the surface 40 of the power module 4. In particular, the at least one second pin 42 is disposed on a periphery region of the surface 40 of the power module 4. Moreover, the main body 2 further comprises plural sidewalls. At least one second opening 21 corresponding to the at least one second pin 42 is formed in at least one sidewall of the main body 2. In this embodiment, plural second openings 21 run through the top part of the main body 2, and the power module 4 comprises plural second pins 42. When the second open end of the hollow part 20 near the bottom part of the main body 2 is covered by the power module 4, the second pins 42 are accommodated within the hollow part 20 of the main body 2 and penetrated through the corresponding second openings 21, and partially protruded out of the top part of the main body 2.

In some embodiments, the package assembly 1 further comprises a heat sink (not shown). In particular, the heat sink is attached on the power module 4 of the package assembly 1. During the operations of the power module 4, the heat generated by the power module 4 may be transferred to the surroundings through the heat sink. Due to the heat sink, the heat dissipating efficiency is enhanced. In this embodiment, the main body 2 of the package assembly 1 comprises a housing frame 5, at least one mounting bracket 6 and a housing base 7. The housing frame 5 is a rectangular hollow box. Moreover, the housing frame 5 comprises plural frame plates 50, a first channel 51 and at least one receiving recess 53. The plural frame plates 50 constitute the plural sidewalls of the main body 2. The bilateral sides of each frame plate 50 are connected with two adjacent frame plates 50, respectively. The first channel 51 is defined by the plural frame plates 50. The mounting bracket 6 comprises a first fixing part 60 and a second fixing part 61. A first end of the first fixing part 60 is connected with and perpendicular to the second fixing part 61. Consequently, the mounting bracket 6 is an L-shaped bracket. The second fixing part 61 is accommodated within the first channel 51. The first end of the first fixing part 60 is locked into the corresponding receiving recess 53, and a second end of the first fixing part 60 is exposed outside the package assembly 1. Moreover, the second end of the first fixing part 60 has at least one mounting hole 62. After a screw (not shown) is penetrated through the mounting hole 62 and tightened into the heat sink, the package assembly 1 can be fixed on the heat sink.

In this embodiment, the housing base 7 is a stepped structure with a first base part 70, a second base part 71 and a second channel 72. The housing base 7 is combined with the housing frame 5. In particular, the first base part 70 is accommodated within the first channel 51, so that the second fixing part 61 of each mounting bracket 6 is clamped between the first base part 70 and the housing frame 5. Since the second fixing part 61 is clamped between the first base part 70 and the housing frame 5, the second fixing part 61 is fixed in the first channel 51. Moreover, the second base part 71 is connected with the first base part 70. The size of the second base part 71 is larger than the size of the first channel 51. Consequently, when the first base part 70 is accommodated within the first channel 51, the second base part 71 is in contact with the bottom surfaces of the plural frame plates 50. Moreover, the second channel 72 runs through the first base part 70 and the second base part 71. The power module 4 is accommodated within the second channel 72 to cover the second channel 72. Moreover, when the housing base 7 and the housing frame 5 are combined together, the first channel 51 and the second channel 72 are in communication with each other to define the hollow part 20 of the main body 2.

Figure 5B:
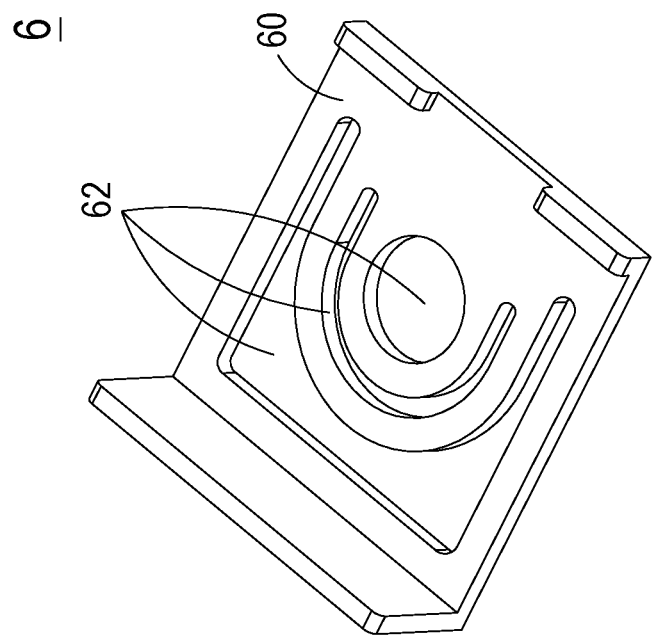
FIG. 5B is a schematic perspective view illustrating a variant example of the mounting bracket of FIG. 5A.
Figure 5A:
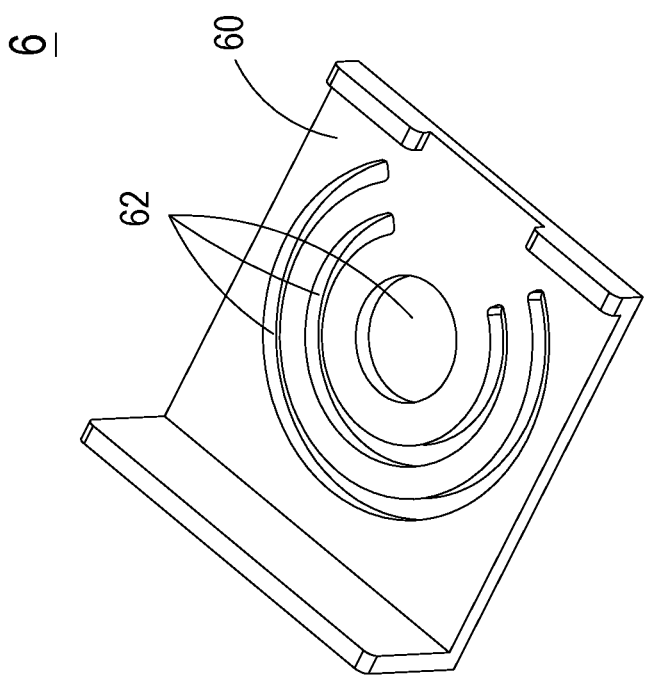
FIG. 5A is a schematic perspective view illustrating the mounting bracket of the package assembly according to the first embodiment of the present invention.

FIG. 5A is a schematic perspective view illustrating the mounting bracket of the package assembly of FIG. 1. FIG. 5B is a schematic perspective view illustrating a variant example of the mounting bracket of FIG. 5A. As shown in FIG. 5A, the first fixing part 60 of the mounting bracket 6 comprises three mounting holes 62. For complying with different types of screws, one of the three mounting holes 62 is a circular hole, and the other two of the three mounting holes 62 are arc-shaped holes of different sizes. As shown in FIG. 5B, the three mounting holes 62 are a circular hole, an arc-shaped hole and a composite square and arc-shaped hole.

Figure 6:
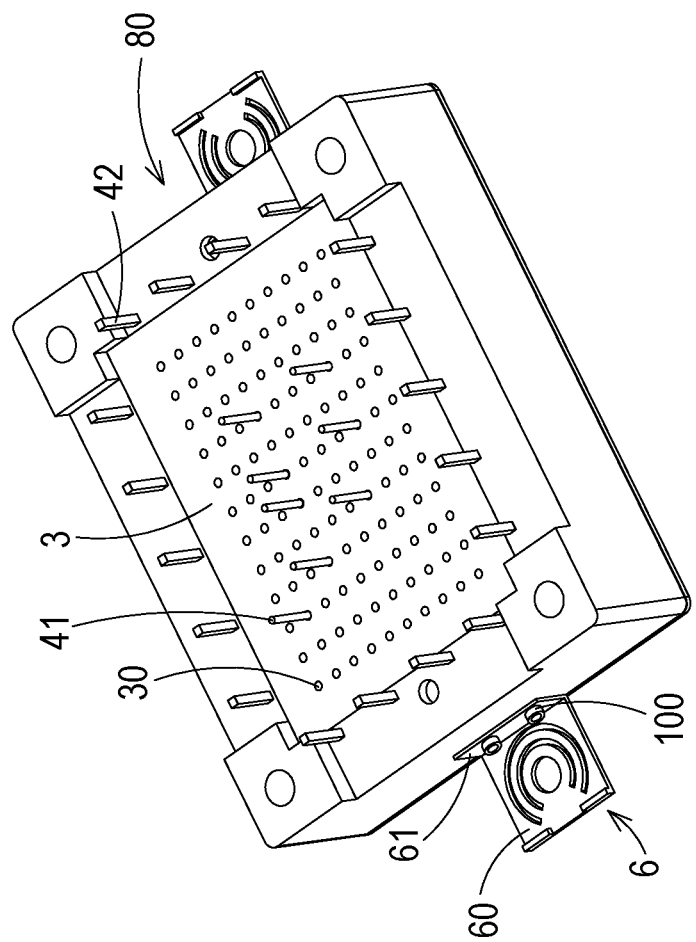
FIG. 6 is a schematic perspective view illustrating a package assembly according to a second embodiment of the present invention.
Figure 7:
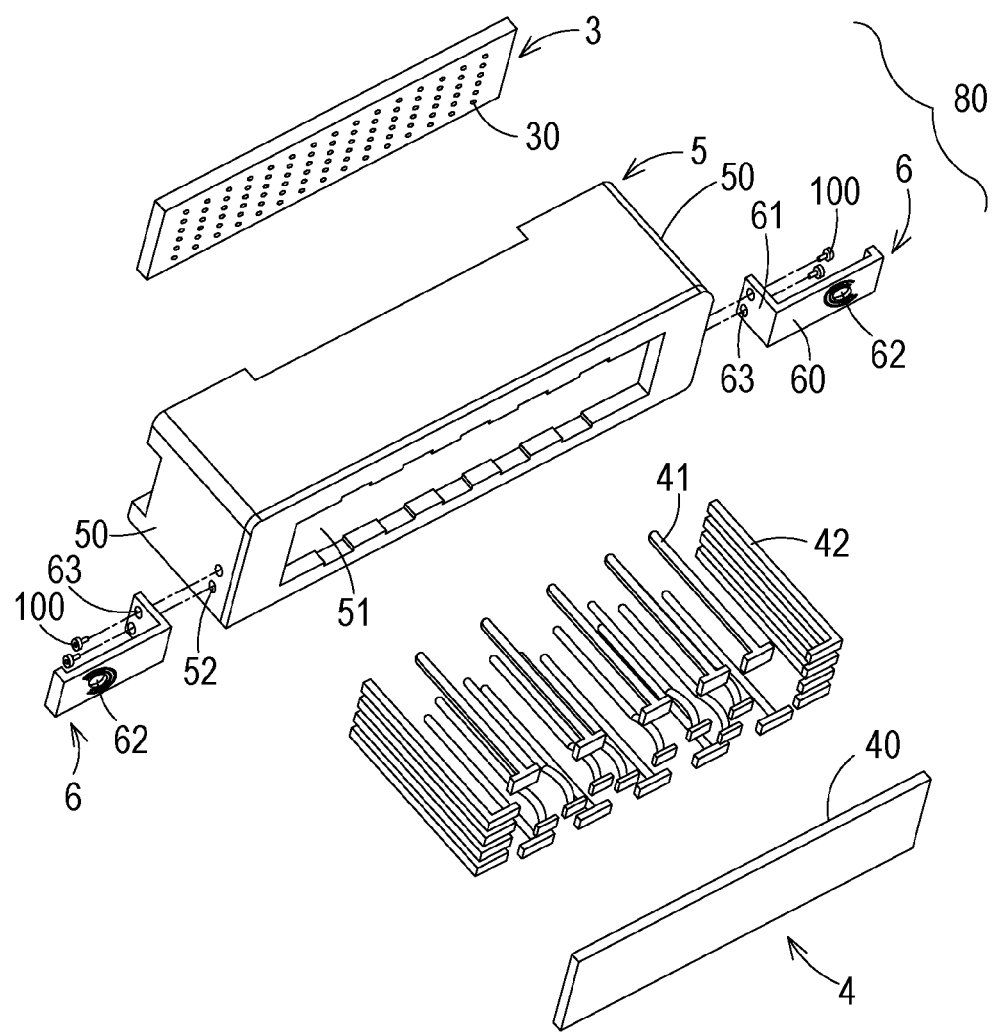
FIG. 7 is a schematic exploded view illustrating the package assembly according to the second embodiment of the present invention.

FIG. 6 is a schematic perspective view illustrating a package assembly according to a second embodiment of the present invention. FIG. 7 is a schematic exploded view illustrating the package assembly of FIG. 6. Please refer to FIGS. 6 and 7. Component parts and elements of the package assembly 8 of this embodiment corresponding to those of the first embodiment are designated by identical numeral references, and detailed descriptions thereof are omitted. In comparison with the package assembly 1 of the first embodiment, the main body 80 of the package assembly 8 of this embodiment is not equipped with the housing base 7. That is, the main body 80 of the package assembly 8 only comprises the housing frame 5 and the two mounting brackets 6. Moreover, the power module 4 is disposed within the first channel 51 of the housing frame 5 to cover the first channel 51. In this embodiment, the hollow part 20 of the main body 80 is defined by the first channel 51. In comparison with the first embodiment, the second fixing part 61 of the mounting bracket 6 of this embodiment is not accommodated within the first channel 51 but attached on an outer surface of the corresponding frame plate 50 of the housing frame 5. Moreover, at least one second mounting hole 52 is formed in the outer surface of the corresponding frame plate 50 of the housing frame 5, and at least one third mounting hole 63 corresponding to the at least one second mounting hole 52 is formed in the second fixing part 61 of the mounting bracket 6. After the second fixing part 61 is attached on the outer surface of the corresponding frame plate 50 of the housing frame 5, a screw 100 is penetrated through the corresponding third mounting hole 63 and the corresponding second mounting hole 52 so as to securely fix the second fixing part 61 on the outer surface of the corresponding frame plate 50 of the housing frame 5 and disposed outside the housing frame 5. Moreover, a bottom surface of the first fixing part 60 is substantially coplanar with a bottom surface of the corresponding frame plate 50 of the housing frame 5.

Figure 8:
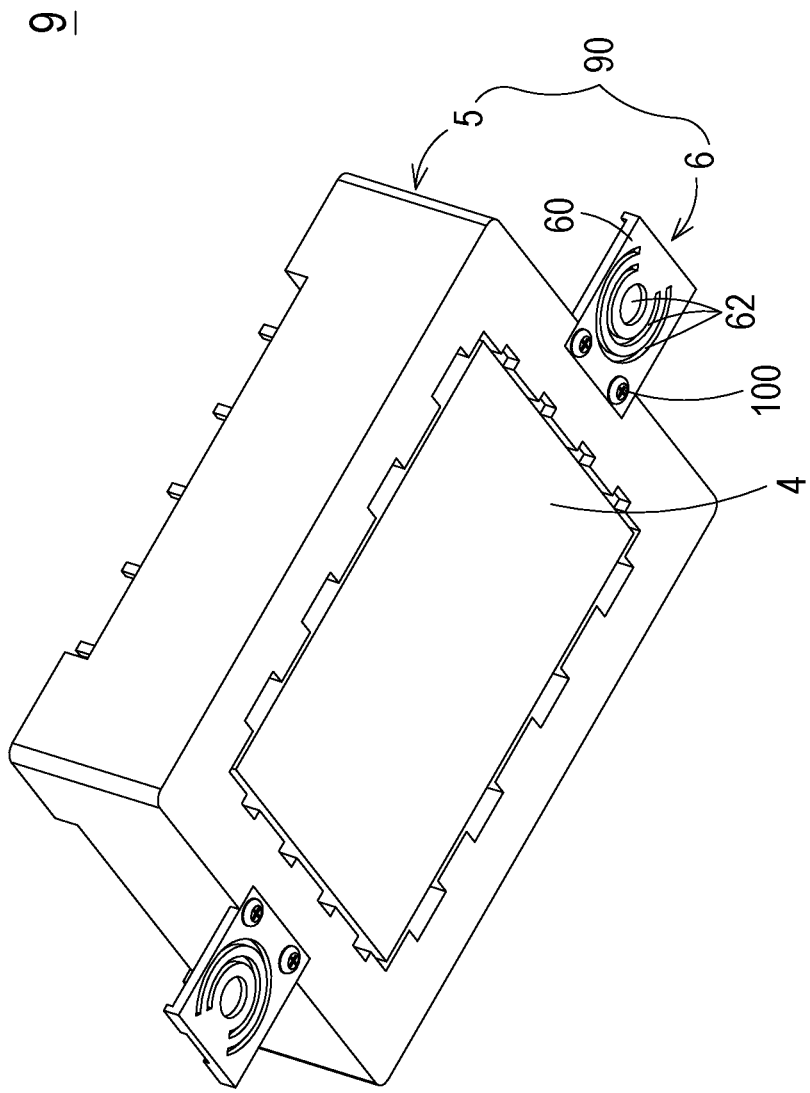
FIG. 8 is a schematic perspective view illustrating a package assembly according to a third embodiment of the present invention.
Figure 9:
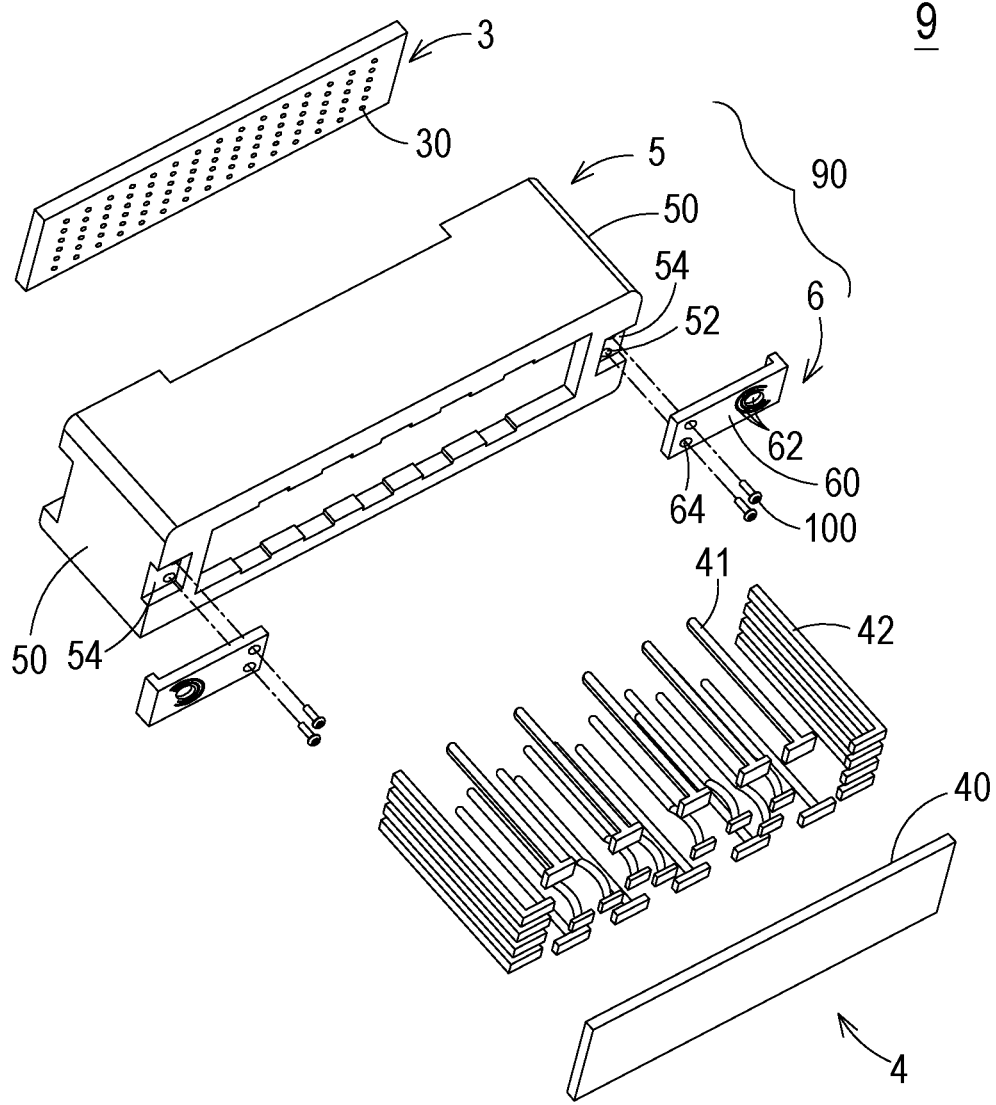
FIG. 9 is a schematic exploded view illustrating the package assembly according to the third embodiment of the present invention.

FIG. 8 is a schematic perspective view illustrating a package assembly according to a third embodiment of the present invention. FIG. 9 is a schematic exploded view illustrating the package assembly of FIG. 8. Please refer to FIGS. 8 and 9. Similarly, the main body 90 of the package assembly 9 of this embodiment is not equipped with the housing base 7, and only comprises the housing frame 5 and the two mounting brackets 6. Component parts and elements of the package assembly 9 of this embodiment corresponding to those of the second embodiment are designated by identical numeral references, and detailed descriptions thereof are omitted. In comparison with the package assembly 8 of the second embodiment, at least one receiving recess 54 is formed in the bottom surface of the corresponding frame plate 50 of the package assembly 9 of this embodiment, and at least one second mounting hole 52 is formed in the corresponding receiving recess 54. Moreover, the mounting bracket 6 of this embodiment only comprises the first fixing part 60, but the second fixing part 61 is omitted. The first fixing part 60 comprises the at least one first mounting hole 62 and further comprises at least one fourth mounting hole 64 corresponding to the at least one second mounting hole 52. Moreover, a first end of the first fixing part 60 is locked into the corresponding receiving recess 54. When the first end of the first fixing part 60 is locked into the corresponding receiving recess 54, a screw 100 is penetrated through the corresponding fourth mounting hole 64 and the corresponding second mounting hole 52 so as to securely fix the first fixing part 60 in the receiving recess 54. Moreover, a bottom surface of the first fixing part 60 is substantially coplanar with a bottom surface of the corresponding frame plate 50 of the housing frame 5. In this embodiment, the fourth mounting hole 64 is formed in the first end of the first fixing part 60, and the first mounting hole 62 is formed in the second end of the first fixing part 60.

From the above descriptions, the present invention provides a package assembly. The package assembly comprises a main body, a power module and a replaceable top cover. The first pins of the power module can be penetrated through the corresponding first openings of the top cover. The top cover is selected according to the positions, number and size of the first pins of the power module. Since the first pins are penetrated through the corresponding first openings, the first pins may be electrically connected with the external circuit. Consequently, the utilization flexibility of the package assembly is enhanced. In the conventional technology, it is necessary to rebuild the mold of the non-plate cover or the non-plate package shell according to the number and positions of the pins of the power module. Since the top cover of the package assembly of the present invention is replaceable, the fabricating cost of the package assembly is largely reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package assembly, comprising:
    a main body having a hollow part, wherein the hollow part runs through a top part and a bottom part of the main body;
    a power module disposed within the hollow part of the main body and located beside the bottom part of the main body, wherein at least one first pin is disposed on a surface of the power module, and the at least one first pin is accommodated within the hollow part of the main body and partially protruded out of a first open end of the hollow part near the top part of the main body; and
    a replaceable top cover disposed in the hollow part of the main body, and comprising at least one first opening corresponding to the at least one first pin, wherein the at least one first pin is penetrated through the corresponding first opening and exposed outside the first open end of the hollow part,
    wherein the main body further comprises a housing frame, and the housing frame comprises plural frame plates and a first channel, wherein the first channel is defined by the plural frame plates,
    wherein the housing frame further comprises a receiving recess, the main body further comprises a mounting bracket, and the mounting bracket comprises a first fixing part and a second fixing part, wherein the second fixing part is accommodated within the first channel, a first end of the first fixing part is locked into the receiving recess, and a second end of the first fixing part is exposed outside the package assembly and has at least one first mounting hole,
    wherein the main body further comprises a housing base, and the housing base is combined with the housing frame, wherein the housing base comprises:
        a first base part accommodated within the first channel, wherein the second fixing part is clamped between the first base part and the housing frame, so that the second fixing part is fixed in the first channel;
        a second base part connected with the first base part, wherein the second base part is in contact with a bottom surface of the housing frame; and
        a second channel running through the first base part and the second base part, wherein the power module is accommodated within the second channel to cover the second channel.

2. The package assembly according to claim 1, wherein the power module comprises a plurality of electronic components embedded within a dielectric substrate.

3. The package assembly according to claim 1, wherein a second open end of the hollow part near the bottom part of the main body is covered by the power module.

4. The package assembly according to claim 1, wherein the top cover is a flat covering plate.

5. The package assembly according to claim 1, wherein the at least one first opening of the top cover comprises plural first openings arranged in a matrix configuration.

6. The package assembly according to claim 1, wherein the at least one first pin is disposed on a middle region of the surface of the power module.

7. The package assembly according to claim 6, wherein at least one second pin is disposed on the surface of the power module, wherein the at least one second pin is disposed on a periphery region of the surface of the power module.

8. The package assembly according to claim 7, wherein the main body further comprises at least one second opening corresponding to the at least one second pin, and the at least one second opening runs through the top part of the main body, wherein the at least one second pin is accommodated within the hollow part of the main body and partially protruded out of the top part of the main body.

9. The package assembly according to claim 1, wherein the first end of the first fixing part is connected with and perpendicular to the second fixing part, so that the mounting bracket is an L-shaped bracket.

10. The package assembly according to claim 1, wherein when the housing base and the housing frame are combined together, the first channel and the second channel are in communication with each other to define the hollow part of the main body.

* * * * *